United States Patent
Maurice et al.

(10) Patent No.: US 10,775,747 B2
(45) Date of Patent: Sep. 15, 2020

(54) GAS CELL FOR AN ATOMIC SENSOR AND METHOD FOR FILLING A GAS CELL

(71) Applicants: CENTRE NATIONAL DE LA RECHERCHE SCIENTIFIQUE—CNRS, Paris (FR); UNIVERSITE DE FRANCHE COMTE, Besancon (FR)

(72) Inventors: Vincent Maurice, Besancon (FR); Nicolas Passilly, Les Auxons (FR); Christophe Gorecki, Pin (FR)

(73) Assignees: CENTRE NATIONAL DE LA RECHERCHE SCIENTIFIQUE—CNRS, Paris (FR); UNIVERSITE DE FRANCHE COMTE, Besancon (FR)

( * ) Notice: Subject to any disclaimer, the term of this patent is extended or adjusted under 35 U.S.C. 154(b) by 0 days.

(21) Appl. No.: 15/745,377

(22) PCT Filed: Jul. 13, 2016

(86) PCT No.: PCT/FR2016/051816
§ 371 (c)(1),
(2) Date: Jan. 16, 2018

(87) PCT Pub. No.: WO2017/009582
PCT Pub. Date: Jan. 19, 2017

(65) Prior Publication Data
US 2018/0210403 A1    Jul. 26, 2018

(30) Foreign Application Priority Data
Jul. 16, 2015 (FR) ...................... 15 56729

(51) Int. Cl.
*H03B 17/00* (2006.01)
*H03L 7/26* (2006.01)
(Continued)

(52) U.S. Cl.
CPC ........... *G04F 5/14* (2013.01); *G01R 33/0047* (2013.01); *G04F 5/145* (2013.01); *H03B 17/00* (2013.01); *H03L 7/26* (2013.01)

(58) Field of Classification Search
CPC ....... G04F 5/14; G04F 5/145; G01R 33/0047; H03B 17/00; H03L 7/26
(Continued)

(56) References Cited

U.S. PATENT DOCUMENTS

| 2011/1232782 | 9/2011 | Borwick, III et al. |
| 2012/0298295 A1 | 11/2012 | Youngner et al. |

(Continued)

FOREIGN PATENT DOCUMENTS

| JP | 2013/007720 A | 1/2013 |
| JP | 2015/046535 A | 3/2015 |
| WO | WO 2014/057229 A1 | 4/2014 |

OTHER PUBLICATIONS

International Search Report related to Application No. PCT/FR2016/051816 dated Sep. 14, 2016.
(Continued)

*Primary Examiner* — Levi Gannon
(74) *Attorney, Agent, or Firm* — Miller, Matthias & Hull LLP

(57) ABSTRACT

The invention relates to a gas cell for an atomic sensor, comprising an optical cavity provided with at least one optical window (9) and fillable with a gas. The cell also comprises a sealing cup comprising a cavity mouth, a channel mouth, and a sealing access, as well as a membrane which hermetically closes the sealing access of the sealing cup. The membrane can be plastically deformed by heating so as to hermetically close the cavity mouth and/or the channel mouth, in such a way as to hermetically separate the optical cavity from the gas inflow channel.

31 Claims, 10 Drawing Sheets

(51) Int. Cl.
*G04F 5/14* (2006.01)
*G01R 33/00* (2006.01)

(58) Field of Classification Search
USPC .................................................. 331/3, 94.1
See application file for complete search history.

(56) References Cited

U.S. PATENT DOCUMENTS

| | | | |
|---|---|---|---|
| 2013/0015920 A1* | 1/2013 | Sato | G04F 5/14 331/94.1 |
| 2014/0139294 A1 | 5/2014 | Harasaka et al. | |
| 2015/0054591 A1* | 2/2015 | Adachi | H03L 7/26 331/94.1 |
| 2015/0061785 A1 | 3/2015 | Ishihara | |
| 2015/0277386 A1* | 10/2015 | Passilly | G04F 5/145 331/94.1 |
| 2016/0308543 A1* | 10/2016 | Ishihara | H03L 7/26 |
| 2018/0212612 A1* | 7/2018 | Park | G04F 5/14 |

OTHER PUBLICATIONS

Lukasz Nieradko, et al., "New Approach of Fabrication and Dispensing of Micromachined Cesium Vapor Cell", J. Micro/Nanolith. MEMS MOEMS, vol. 7(3), 033013, pp. 1-6, Aug. 6, 2008.

S. Abdullah, et al., "Aging Study on a Micro-Fabricated Cs Buffer-Gas Cell for Atomic Clock Applications", Swiss National Science Foundation and the CTI, 978-1-4799-5252-6/14., pp. 178-181, 2014.

L. Nieradko, et al., "From the Implementation to the Characterisation and Assembling of Microfabricated Optical Alkali Vapor Cell for MEMS Atomic Clocks", Transducers & Eurosensors '07, The 14$^{th}$ International Conference on Solid-State Sensors, Actuators and Microsystems, Lyon, France, Jun. 10-14, pp. 45-48, 2007.

D. Miletic, et al., "Quadratic Dependence On Temperature of Cs 0-0 Hyperfine Resonance Frequency in Single Ne Buffer Gas Microfabricated Vapor Cell", Published in Electronics Letters 46, Issue 15, 1069-1071, 2010.

A.M. Braun, et al., "RF-Interrogated End-State Chip-Scale Atomic Clock", 39$^{th}$ Annual Precise Time and Time Interval (PTTI) Meeting, pp. 233-248, Nov. 26-29, 2007, Long Beach, CA.

\* cited by examiner

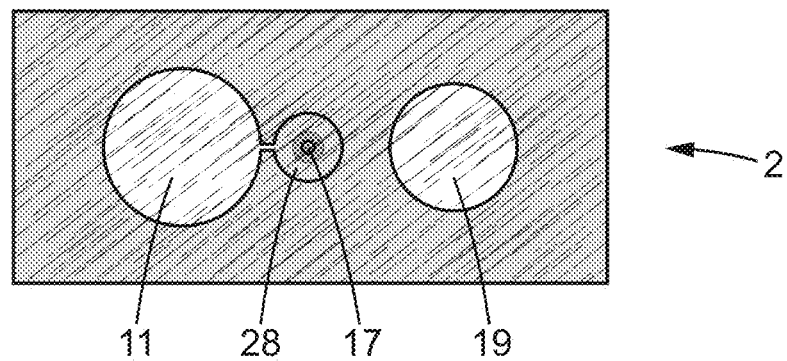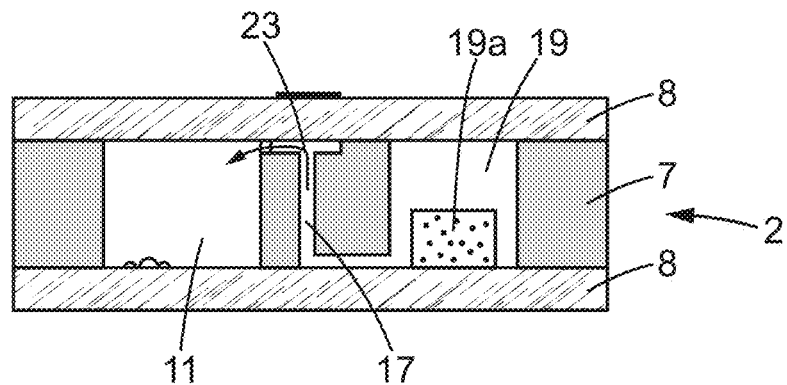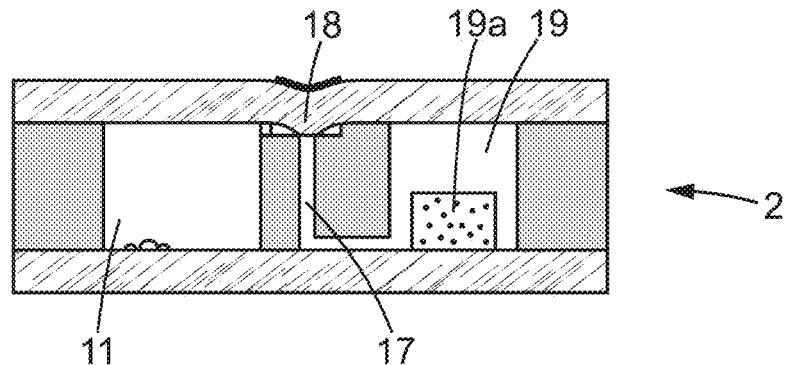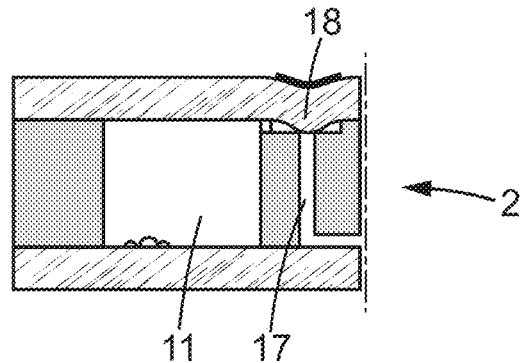

GAS CELL FOR AN ATOMIC SENSOR AND METHOD FOR FILLING A GAS CELL

CROSS-REFERENCE TO RELATED APPLICATION

This Application is a 35 USC § 371 US National Stage filing of International Application No. PCT/FR2016/051816 filed on Jul. 13, 2016, and claims priority under the Paris Convention to French Patent Application No. 15 56729 filed on Jul. 16, 2015.

FIELD OF THE DISCLOSURE

The invention concerns the field of gas cells and atomic sensors comprising gas cells. The term "gas" may refer to any gas, a vapor or an alkali vapor, or a mixture of a gas and a vapor.

BACKGROUND OF THE DISCLOSURE

Atomic sensors comprise for example atomic clocks, micro-magnetometers, or micro-gyros. Such atomic sensors may for example be for telecommunication, navigation, and defense systems.

Such optical gas cells are sometimes called "cells" or "microcells", and the associated sensors "micro-atomic clocks", "micro-magnetometers", and "micro-gyros." Throughout the text, the term "micro" is to be understood within the context and with the meaning indicated.

A typical application is a chip-scale atomic clock, known by the acronym CSAC.

The operation of atomic sensors is based on optical spectroscopy of atoms of a gas filling the cavity of a cell provided with at least one optical window. This cavity is thus described as an "optical cavity". The gas is usually an alkali vapor, such as cesium or rubidium. This spectroscopy enables measuring one or more spectral values associated with the physical quantity or quantities which the sensor is to observe, for example a frequency, a magnetic field, or an acceleration.

For example in the case of a micro-atomic clock, the operation of the sensor can be based on measuring the frequency of a particular microwave transition of the gas atoms, called the clock transition. In this application, the micro-atomic clock then typically implements the principle of atomic resonance by coherent population trapping, known by the acronym CPT.

Furthermore, the width of the line observed by spectroscopy, and thus the frequency stability in the case of an atomic clock, is determined by the relaxation time of the alkali atoms starting from the coherent state in which they were pumped to their ground state, a time which is primarily dependent on atom collisions with the cell walls, resulting in loss of coherence.

To improve the quality of the spectroscopy of the gas, and thus the accuracy and stability of the atomic sensor, it is well known to add a gas to the alkali vapor, referred to as buffer gas or buffer atmosphere, which slows the diffusion of alkali atoms toward the cell walls and confines said alkali atoms.

Such atomic sensors offer the advantage of being small in size and energy efficient, and of having very good measurement precision and stability.

An example of such an atomic sensor is known from the work of the MAC-TFC consortium, in which the FEMTO-ST Institute (acronym for Franche-Comté Electronique Mécanique Thermique et Optique-Sciences et Technologies) has designed and built a highly compact cesium vapor cell (a few mm3) for an atomic clock, with MEMS (acronym for MicroElectroMechanical Systems) micromachining of the silicon and anodic bonding (for example see "New approach of fabrication and dispensing of micromachined cesium vapor cell" by L, Nieradko, C. Gorecki, A. Douahi, V. Giordano, J.C. Beugnot, J. Dziuban, and M. Moraja published in JOURNAL OF MICRO-NANOLITHOGRAPHY MEMS AND MOEMS of August 2008).

The production of optical gas cells and of such atomic sensors usually relies on methods that microfabricate stacks of silicon and glass substrates fixed together by anodic bonding.

A usual cell microfabrication method begins by etching cavities in a silicon substrate. A first glass substrate is then welded, usually by anodic bonding, on one side of this substrate. Finally, a second glass substrate is welded to the opposite side after incorporation of the buffer atmosphere and the alkali metal, which may take various forms depending on the filling method used.

To introduce the alkali metal into the optical cavity, the fabrication may be carried out, particularly the step of anodic bonding, in an atmosphere containing cesium and a buffer gas or by depositing a certain amount of alkali metal in liquid or solid form into a cell cavity.

However, there are complications when sealing in the presence of pure cesium. The anodic bonding must start at a low temperature, to avoid evaporation of the metal deposited in the cavity, and continues as the temperature is increased. This can lead to pressure differences in the buffer gas as indicated in document US2012/0298295A1.

To simplify fabrication of the atomic sensor and to allow using standard anodic bonding equipment in optimum conditions, it is known to use a solid compound called a dispenser that is introduced into the cell during the sealing step. Such a compound is for example made of an alloy of Zr—Al and cesium chromate, suitable for remaining stable at the temperature of the anodic bonding. The dispenser is then locally heated, for example by means of a high-power laser, to release pare cesium and create saturated vapor in the cell. After activation, most of the cesium atoms are in liquid phase or solid phase depending on the temperature. Such a method is detailed for example in the document "From the Implementation to the Characterisation and Assembling of Microfabricated Optical Alkali Vapor Cell for MEMS Atomic Clocks" by Nieradko, Lukasz, et al., published in 2007 in the Solid-State Sensors journal, pages 45-48.

Although it simplifies fabrication of the sensor, the presence of a dispenser in each cell is also a constraint. It limits the density of cells that can be achieved on a wafer, which increases the production cost per cell. It also increases the size of the cell, and therefore that of the atomic sensor in which it is integrated. The cell also suffers from greater thermal dissipation (larger radiating surface). Furthermore, the use of one dispenser per cell imposes a substantial fixed cost for each cell. The amount of cesium released during the heat activation is also difficult to control. The amount of alkali metal can thus vary significantly between cells in the same batch. There can then be excessive condensation of cesium which can obstruct the optical window, or conversely the amount of cesium may be insufficient to ensure a satisfactory service life. Furthermore, a study has indicated that the dispenser could cause variations in the atmosphere and compromise the performance of the clock in which it is integrated ("Aging Study on a Micro-Fabricated Cs Buffer-Gas Cell for Atomic Clock Applications" by Abdullah, Salman et al. published in 2014 in Proc. European Frequency and Time Forum). Finally, the dispenser is usually not fixed in the cavity, and can strike the walls if the cell is subjected to impacts or vibration. The component particles of the dispenser can then break up and obstruct the optical window.

SUMMARY OF THE DISCLOSURE

One objective of the invention is therefore to eliminate the presence of a dispenser in the final cell or to prevent interactions between the dispenser and the atmosphere of the optical cavity.

The auxiliary buffer gas in the cell may be composed of one or more atomic or molecular species.

However, the presence of a buffer atmosphere has the disadvantage of introducing a dependency of the spectroscopic measurement on the cell temperature (for example a quadratic dependence of the frequency of the clock transition on the temperature).

Temperature variations of the cell thus result in variations in the measured spectral values and therefore the measurement of the atomic sensor.

It is therefore necessary to use a buffer atmosphere for which the induced thermal dependence on the spectral values presents an inversion point around the cell operating temperature.

It is known, in particular from the document "Quadratic Dependence on Temperature of Cs 0-0 Hyperfine Resonance Frequency in Single Ne Buffer Gas Microfabricated Vapor Cell" by Miletic, Danijela et al., published in 2010 in the Electronics Letters journal Vol. 46, that a buffer atmosphere composed solely of neon cancels out the temperature dependence of the frequency of the clock transition around 80° C.

Such a buffer atmosphere allows operating the atomic sensor within a temperature range limited to a few degrees below the operating temperature of the cell, for example to 70-75° C. for a pure neon buffer atmosphere, because energy constraints usually only permit heating the cell without being able to cool it and the associated electronics also dissipate energy as heat.

However, to meet current industry standards, these systems must be able to operate within a range of −40° C. to +85° C., or an even wider range for some applications.

Also known are buffer atmospheres composed of dinitrogen and argon which allow obtaining, by adjusting the partial pressures of the mixture, a variable inversion point of up to 120° C. as described in the document "RF-Interrogated End-State Chip-Scale Atomic Clock" by Braun, Alan M et al., published in 2007 in the 39th Annual Precise Time and Time Interval Meeting.

The use of dinitrogen with a dispenser has disadvantages, however, because dinitrogen is absorbed by the dispenser.

Other buffer atmospheres composed of rare gases which do not react with the dispenser have also been studied, but these have drawbacks. These mixtures are difficult to contain in a stable manner, impose unwanted spectral broadening, and are generally less favorable than dinitrogen for mitigating the radiation trapping effect which reduces signal quality and the performance of the sensor.

Another object of the invention is therefore to enable the use, in a vapor cell, of a variety of buffer gases without the operation or fabrication of the vapor cell presenting the disadvantages detailed above.

Finally, during the anodic bonding process, molecules composed of oxygen may be generated. Existing methods therefore do not allow reaching vacuum levels below $10^{-4}$ mbar, which are necessary for applications such as magneto-optical trapping of atoms or ion trapping.

Yet another object of the invention is therefore to improve the quality of the vacuum in comparison to what is usually obtained when sealing by anodic bonding.

The first object of the invention is therefore a gas cell, intended in particular for inclusion in an atomic sensor such as an atomic clock, an atomic magnetometer, or an atomic gyro, associated with at least one laser emitting an incoming exterior laser beam striking the cell as well as with a photodetector for receiving an exterior laser beam exiting the cell, the laser beam having penetrated the cell, the cell comprising a cavity provided with at least one optical window and adapted to be filled with a gas.

The cell further comprises
   a sealing basin comprising
      a cavity mouth adapted to allow the passage of gas between the sealing basin and the optical cavity,
      a channel mouth designed to allow gas to enter the sealing basin via a gas inflow channel, and
      a sealing access, and
   a membrane hermetically closing the sealing access of the sealing basin.

The cell is arranged such that the membrane is capable of hermetically closing at least one among the cavity mouth and the channel mouth when said membrane is plastically deformed by heating, in such a way as to hermetically separate the optical cavity from the gas inflow channel.

In one embodiment, the cell further comprises a heating device in contact with the membrane, in particular a resistive element adapted to be traversed by an electric current or a layer of a material that is absorbent to at least one wavelength of light which is not substantially absorbed by the membrane.

In one embodiment, the cell comprises a multilayer assembly comprising:
   a shapeable plate—or wafer—shaped to present a recess with at least one opening, said recess being adapted to be filled with a gas, and
   at least one glass plate—or wafer—hermetically closing said opening of the recess to form the optical cavity provided with at least one optical window, the glass plate—or wafer—and the shaped plate—or wafer—with recess being arranged facing one another and sealed to one another, in particular by anodic bonding.

In one embodiment, the membrane is a portion of the glass plate—or wafer, and in particular the optical window and the membrane are formed by two portions separated from one another by a single glass plate—or wafer.

In one embodiment, the shapeable plate—or wafer—is shaped to present a second recess forming the sealing basin and opening into at least a second opening forming the sealing access.

In one embodiment, the sealing basin and the membrane are formed in the glass plate—or wafer, in particular the glass plate—or wafer—comprises at least a first glass sub-layer and a second glass sub-layer which are superimposed and integrally secured, the sealing basin being formed in the first glass sub-layer, the membrane being formed in the second glass sub-layer.

In one embodiment, the glass plate—or wafer—comprises a first glass sub-layer and a second glass sub-layer and the multilayer assembly further comprises an intermediate layer for anodic bonding, in particular of silicon, arranged between the first glass sub-layer and the second glass sub-layer so as to enable anodic bonding between the first glass sub-layer and the second glass sub-layer, in particular the membrane is formed in the second glass sub-layer, at least the cavity mouth is formed in the first glass sub-layer, and the intermediate layer for anodic bonding is shaped to leave at least the optical window unobstructed.

In one embodiment, the gas inflow channel is formed in at least one among the shapeable plate—or wafer—and the glass plate—or wafer, so as to substantially traverse the entire thickness of said plate—or wafer—in a manner substantially perpendicular to a plane of extension of said plate—or wafer.

In one embodiment, the membrane is glass, and in particular is a thinned portion of a glass plate—or wafer.

In one embodiment, the membrane comprises a protrusion facing the sealing basin, in particular a protrusion on the inner face of the membrane, extending into the sealing basin.

In one embodiment, the sealing basin comprises a sealing area surrounding the channel mouth, substantially planar and parallel to the non-deformed membrane, and adapted to form a hermetic contact with the membrane plastically deformed by heating so as to hermetically separate the optical cavity from the gas inflow channel.

In one embodiment, a distance between the non-plastically deformed membrane and the sealing area—measured perpendicularly to said non-plastically deformed membrane and said sealing area—is less than a hundred microns.

In one embodiment, a diameter of the sealing area of the sealing basin is greater than three times said distance between the non-plastically deformed membrane and the sealing area.

In one embodiment, a thickness of the membrane is less than 500 microns, preferably less than 200 microns.

In one embodiment, the cell comprises a gas source connected to the gas inflow channel and adapted to fill the optical cavity with a gas via the gas inflow channel and the sealing basin, by means of the cavity mouth and the channel mouth.

In one embodiment, the source comprises a source cavity connected to the gas inflow channel and a dispenser of alkali metal received in the source cavity and adapted to generate alkali vapor by heating.

In one embodiment, the cell comprises, in addition to the optical cavity, an additional cavity filled with an additional gas, adjacent to the optical cavity and separated therefrom by a wall intended to be pierced to enable mixing said additional gas with a gas contained within the optical cavity.

In one embodiment, the wall of the additional cavity is adapted to be pierced by a contactless action exogenous to the cell 2, in particular by interaction of a pulsed laser beam, a continuous laser beam, or an electrical discharge, with the wall.

In one embodiment, the optical cavity is filled with a gas, and the membrane is in a plastically deformed state in which the membrane hermetically closes at least one among the cavity mouth and the channel mouth, hermetically separating the optical cavity from the gas inflow channel.

The invention also relates to a set of cells comprising a plurality of cells as described above, wherein the gas inflow channels are connected to a single gas source, in particular wherein said plurality of cells forms an integral and rigid assembly adapted to be cut so as to detach the cells from one another.

The invention further relates to a method for filling a cell with gas, wherein:

a cell as described above or a set of cells as described above is provided, a gas source connected to the gas inflow channel of the cell or set of cells is provided, the optical cavity is filled with gas from the source via the gas inflow channel and the sealing basin, by means of the cavity mouth and the channel mouth, and the membrane is plastically deformed by heating so as to hermetically close at least one among the cavity mouth and the channel mouth, in such a way that it hermetically separates the optical cavity from the gas in flow channel.

In one embodiment, the membrane is plastically deformed by heating an outer face of the membrane, said outer face being in particular a face external to the cell.

In one embodiment, the membrane is plastically deformed by heating using a laser directed onto the membrane.

In one embodiment, the membrane is plastically deformed by heating, by allowing an electric current to flow through a resistive element in contact with the membrane.

In one embodiment, the source is a dispenser of alkali metal received within a source cavity connected to the gas inflow channel of the cell or the set of cells, and the optical cavity is filled by heating said dispenser.

In one embodiment, after the membrane is plastically deformed in order to hermetically separate the optical cavity from the gas inflow channel, the cell is detached from the gas source.

In one embodiment, after the membrane is plastically deformed in order to hermetically separate the optical cavity from the gas inflow channel, a wall separating the optical cavity from an additional cavity filled with an additional gas is pierced so as to mix said additional gas with the gas contained within the optical cavity.

In one embodiment, a set of cells as described above is provided, and, after having filled the optical cavity with gas from the source, at least the gas cavities of the cells of the set of cells are brought to a temperature above a first predefined temperature, said first predefined temperature being greater than a cell operating temperature of the set of cells, and a cold region of the set of cells is brought to a second predefined temperature that is strictly less than the first predefined temperature, the membrane of each cell of the set of cells is plastically deformed by heating while maintaining the temperatures of the gas cavities of the cells and the cold region of the set of cells, and the gas cavities of the cells of the set of cells are cooled to the operating temperature of said cells, The invention further relates to a method for creating a vacuum in a cell, wherein:

a cell as described above or a set of cells as described above is provided, a pumping station connected to the gas inflow channel of the cell or set of cells is provided, the pumping station is operated so as to suction gas contained in the optical cavity via the gas inflow channel and sealing basin, by means of the cavity mouth and channel mouth, and the membrane is plastically deformed by heating so as to hermetically close at least one among the cavity mouth and the channel mouth, in such a way as to hermetically separate the optical cavity from the gas inflow channel.

The invention further relates to a method for fabricating a cell as described above, wherein a shapeable plate—or wafer—and at least one glass plate—or wafer—is provided, the shapeable plate—or wafer—is shaped, in particular is etched, to form a recess opening into at least one opening, at least one among the shapeable plate—or wafer—and the glass plate—or wafer is shaped, in particular etched, so as to form a gas inflow channel and a sealing basin comprising
- a cavity mouth adapted to allow the passage of gas between the sealing basin and the optical cavity,
- a channel mouth designed to allow gas to enter the sealing basin via the gas inflow channel, and
- a sealing access, a multilayer assembly comprising the shapeable plate—or wafer—and said at least one glass plate—or wafer—is formed such that
- the opening of the recess is hermetically closed to form an optical cavity having at least one optical window and adapted to be filled with a gas, and
- the sealing access is hermetically closed with a membrane capable of being plastically deformed by heating so as to hermetically close at least one among the cavity mouth and the channel mouth, in such a way as to hermetically separate the optical cavity from the gas inflow channel.

Lastly, the invention relates to an atomic sensor comprising a cell as described above, associated in a compact manner with a laser emitting an incoming exterior laser beam striking the cell, and with a photodetector for receiving an exterior laser beam exiting the cell.

BRIEF DESCRIPTION OF THE DRAWINGS

In the drawings

FIGS. 2A to 2F illustrate the successive steps of a method for producing a cell such as the one represented in FIG. 1, shown in cross-section in FIGS. 2A to 2E and in a top view in FIG. 2F; specifically, FIGS. 2A to 2C illustrate the shape of a shapeable plate—or wafer, FIG. 2D the assembly of the shapeable plate—or wafer and the glass plate—or wafer—in order to form a multilayer assembly and create the actual cell, FIG. 2E the sealing of the cell after it is filled with gas, by deformation of the membrane, and FIG. 2F illustrates a top view of the cell of FIG. 2E, FIGS. 3A to 3C illustrate the successive steps of a method for filling with gas a cell such as the one shown in FIGS. 1 and 2A to 2E; specifically, FIG. 3A illustrates the filling of the optical cavity with gas, FIG. 3B the sealing of the cell after filling, by deformation of the membrane, and FIG. 3C the detachment of the cell from the alkali metal source, FIG. 7A illustrates the filling of the optical cavity with gas, FIG. 7B the sealing of the cell after filling, by deformation of the membrane, and FIG. 7C the piercing of the wall separating the additional cavity from the optical cavity in order to mix the additional gas and the gas of the optical cavity.

FIG. 10A illustrates the filling of the optical cavity with gas, and FIGS. 10B and 10C the sealing of the cell after filling, by deformation of the membrane.

DETAILED DESCRIPTION OF THE DISCLOSURE

Figure 1:
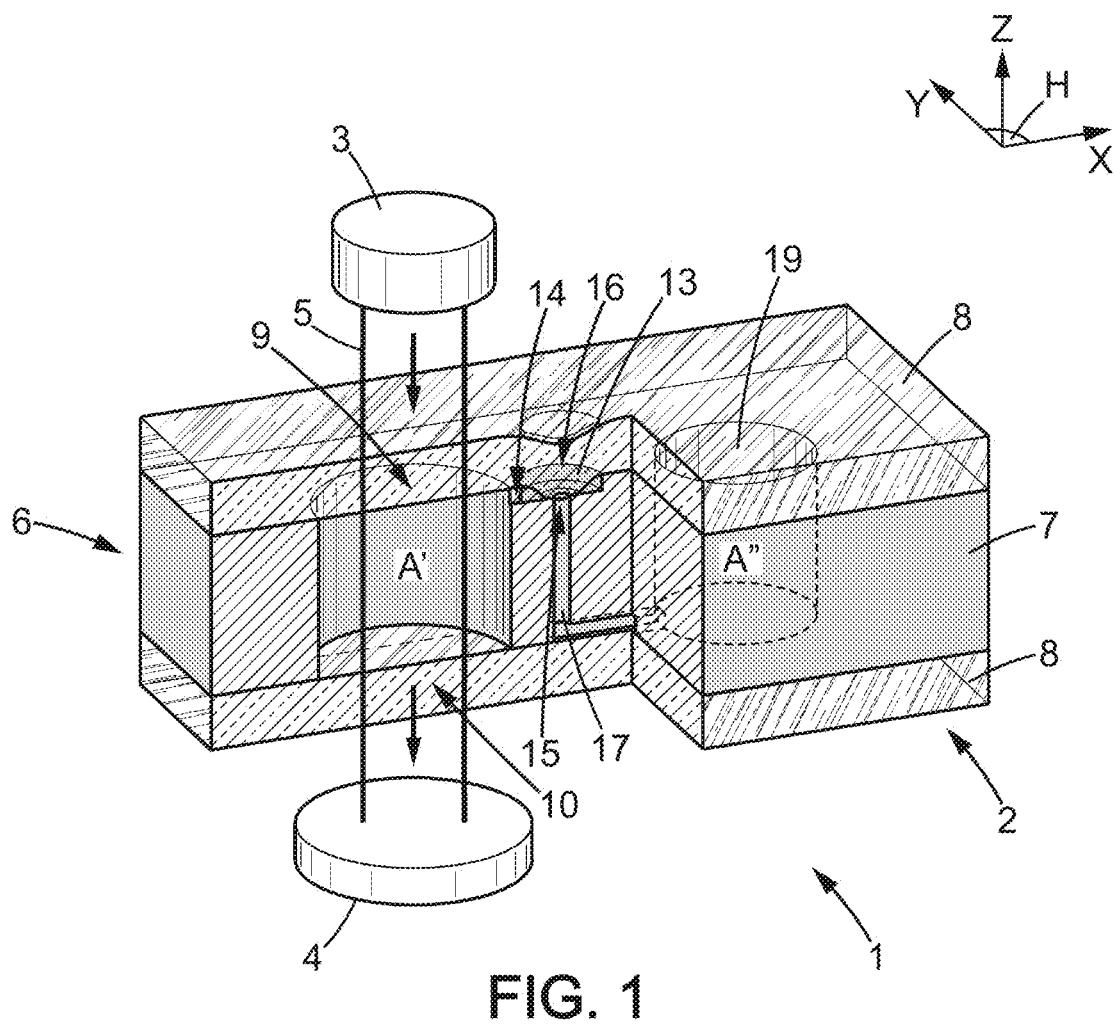
FIG. 1 is a schematic perspective view in section of an atomic sensor according to an embodiment of the invention, comprising a gas cell according to an embodiment of the invention, with which are associated a laser emitting an incoming laser beam striking the cell and a photodetector for receiving an exterior laser beam exiting the cell.

In the various figures, the same references designate identical or similar elements, FIG. 1 illustrates an example of an atomic sensor 1 according to the invention, incorporating a cell 2.

The atomic sensor 1 is for example a chip-scale atomic clock (CSAC) based on the principle of atomic resonance by coherent population trapping (CPT). The atomic sensor 1 comprises an alkali vapor (cesium) cell 2 with which are associated: a laser 3 for emitting an incoming exterior laser beam striking the cell 2, for example a vertical cavity surface emitting laser (VCSEL); and a photodetector 4 for receiving an exterior laser beam exiting the cell 2. The laser beam is denoted 5.

The cell 2 comprises an optical cavity 11 which is provided with at least one optical window 9 and is adapted to be filled with a gas.

The gas comprises for example an alkali vapor such as cesium or rubidium, and possibly a buffer gas.

To this end, the cell 2 comprises a multilayer assembly 6 which takes the form for example of a housing 6. This multilayer assembly 6 first comprises a plate—or wafer—7, referred to as "shapeable plate—or wafer—7" or "plate—or wafer—7 shaped to have a recess" depending on whether the original unshaped state or the shaped state is being considered, given that it is ultimately shaped to have a recess as described.

The plate—or wafer—7 extends in a plane of extension H between a first face 7a and a second face 7b, opposite one another and substantially parallel to the plane of extension H.

Figure 2A:
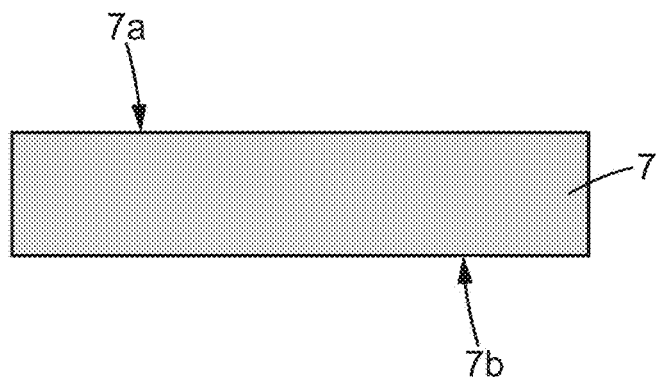
Figure 2B:
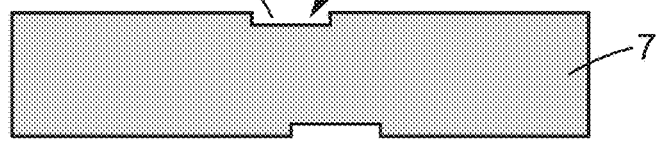
Figure 2C:
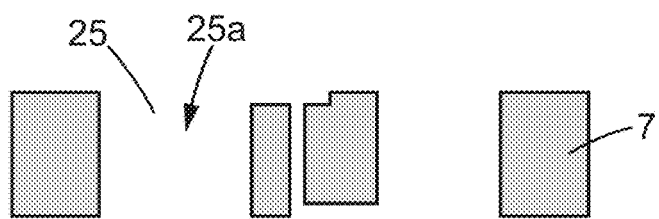

As shown in FIGS. 2A-2C, the plate—or wafer—7 is shaped to have a recess 25 on at least one of its faces 7a, 7b, opening into at least one opening 25a, on at least one of its faces 7a, 7b.

The recess 25 is understood as being relative to a front base plane S of the plate—or wafer—7, to which is applied the glass plate—or wafer—8, for example to the first face 7a.

To form the recess 25, the shapeable plate—or wafer—7 may be etched, in particular etched via the opening 25a of the recess 25. The recess 25 may for example be formed by deep reactive ion etching or KOH anisotropic etching.

The recess 25 is adapted to be filled with a gas in order to form a portion of the optical cavity 11.

The multilayer assembly 6 secondly comprises at least one glass plate—or wafer—8 which is formed of a single plate or of several stacked plates as will be detailed below.

The glass plate—or wafer—8 is arranged to hermetically close the opening 25a of the recess 25 so as to form, with said recess 25, the optical cavity 11 provided with at least one optical window.

To this end, the plate—or wafer—7 shaped to have a recess and the glass plate—or wafer—8 are arranged facing one another, one against the other.

The glass plate—or wafer—8 extends for example also in a plane of extension H between a first face 8a and a second face 8b which are opposite one another and substantially parallel to the plane of extension H.

One face 8a, 8b of the glass plate—or wafer—8 is thus facing and in contact with one face 7a, 7b of plate—or wafer—7.

The plates 7, 8 are bonded to each other, in a fixed and sealed manner, in particular by anodic bonding between their facing sides.

The multilayer assembly 6 (and by extension the cell 2) may have an external shape that is cylindrical or parallelepiped or some other shape. It is generally flat and compact with a volume which can be a few mm$^3$ or a few tens of mm$^3$. It has a plane of extension H, and two perpendicular transverse planes, namely a first transverse plane which is the plane of FIGS. 2A to 2E (and the midplane of the optical cavity 11) and a perpendicular second transverse midplane.

The cell 2 thus comprises at least one optical window 9 formed by a portion of the glass plate—or wafer—8.

The cell 2 may also comprise a second optical window 10 which may be arranged on the same side of the cell 2 as the optical window 9, the two optical windows being for example formed by two spaced-apart portions of the glass plate—or wafer—8.

Alternatively, the second optical window 10 may be arranged on one side of the cell 2 opposite to the side of optical window 9, the two optical windows being formed by two separate glass plates—or wafers—8, placed on respectively opposite faces 7a, 7b of the plate—or wafer—7 shaped to form a recess.

The cell 2 further comprises a sealing basin 13.

The sealing basin 13 is provided with a cavity mouth 14, a channel mouth 15, and a sealing access 16.

The cavity mouth 14 is adapted to allow the passage of gas between the sealing basin 13 and the optical cavity 11.

The channel mouth 15 is designed to allow gas into the sealing basin 13 via a gas inflow channel 17.

Figure 2D:
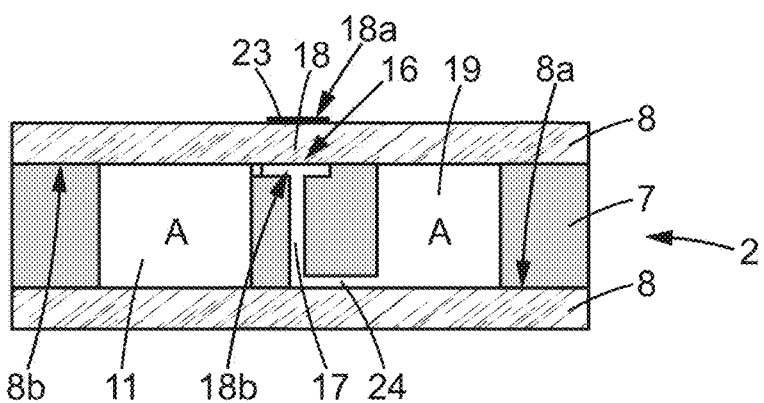

Finally, the sealing port 16 is hermetically closed by a membrane 18 (shown in FIG. 2D).

The membrane 18 is adapted to be plastically deformed by heating so as to hermetically seal at least one among the cavity mouth 14 and the channel mouth 15, so as to hermetically separate the optical cavity 11 from the gas inflow channel 17.

The membrane 18 may be in particular be of glass so that it can be plastically deformed easily and ensures a gas-tight hermetic seal of at least one among the cavity mouth 14 and the channel mouth 15.

More specifically, the membrane 18 is adapted to be placed, first, in an initial state—or non-deformed state—illustrated in FIGS. 2D, 3A, 4G, 7A and 8A.

In this initial state, the membrane 18 is substantially planar and does not obstruct either the cavity mouth 14 or channel mouth 15. In this state of the membrane 18, there is therefore communication between the optical cavity 11 and the gas inflow channel 17, by means of the sealing basin 13.

It is thus possible to fill the optical cavity 11 with gas supplied via the gas inflow channel 17 and the sealing basin, by means of the cavity mouth and the channel mouth.

For example, a source cavity 19 may be connected to the gas inflow channel 17.

Such a source cavity 19 may receive a source of alkali metal such as cesium or rubidium, in different forms.

The source of alkali metal may be a pure alkali metal in solid or liquid state.

The source of alkali metal may be a chemical compound comprising alkali atoms which are then released by subsequent thermal or radiation treatment.

The source of alkali metal may be a dispenser 19a of alkali metal such as cesium or rubidium, the alkali vapor being generated by heating the dispenser 19a, in particular after sealing the cell 2 and before plastic deformation of the membrane 18.

The source cavity 19 may be formed in the shapeable plate—or wafer—7, for example by shaping a recess in the shapeable plate—or wafer—7 in order to provide a recess in the manner described above concerning the optical cavity 11. The shapeable plate—or wafer—7 can thus be etched by ion and/or chemical etching.

The source cavity 19 can thus be adjacent to the optical cavity 11, and connected to said optical cavity 11 via the gas inflow channel 17 and the sealing basin 13.

Such a source cavity 19 may also be filled with gas and connected to the gas inflow channel 17.

Such a source cavity 19 may also be connected to a source of gas or alkali metal exogenous to the cell 2 or to the multilayer assembly 6.

Figure 3D:
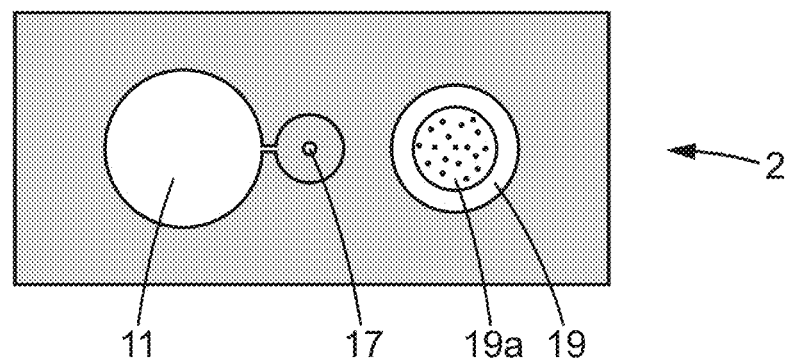
FIG. 3D illustrates a top view of the cell of FIG. 3B.
Figure 3E:
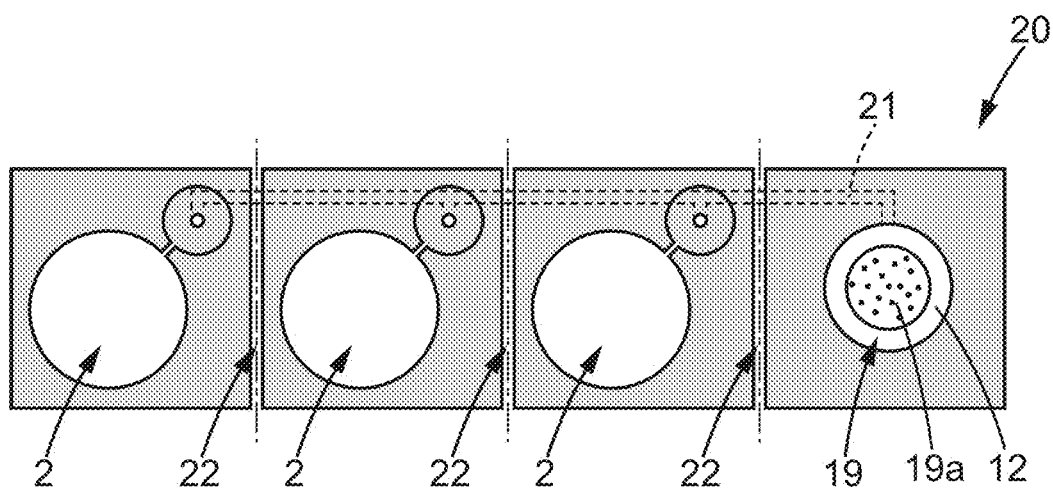
FIG. 3E illustrates a top view of a set of cells comprising a plurality of cells such as the one in FIGS. 3A to 3D, FIGS. 4A to 4I illustrate the successive steps of a method for producing a cell according to a second embodiment of the invention wherein the sealing basin and the membrane are defined in the glass plate—or wafer, showing a cross-section for FIGS. 4A-4H and a top view for FIG. 4I; specifically.
Figure 4A:
FIGS. 4A to 4F illustrate the defining of the sealing basin and the membrane in the first glass sub-layer and second glass sub-layer of a glass plate—or wafer, FIG. 4G the assembly of a shapeable plate—or wafer—and a glass plate—or wafer—to form a multilayer assembly and create the actual cell, FIG. 4H the sealing of the cell after filling with gas, by deformation of the membrane.
Figure 4B:
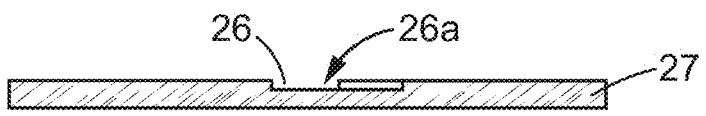
Figure 4C:
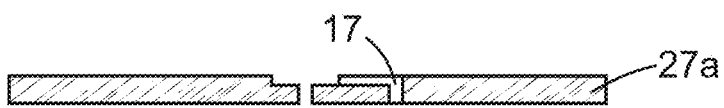
Figure 4D:
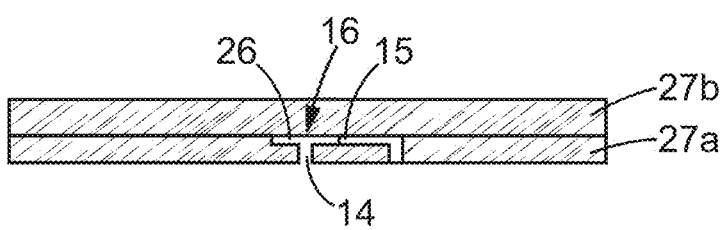
Figure 4E:
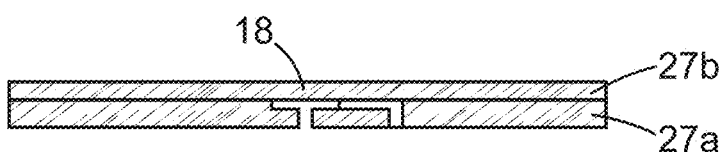
Figure 4F:
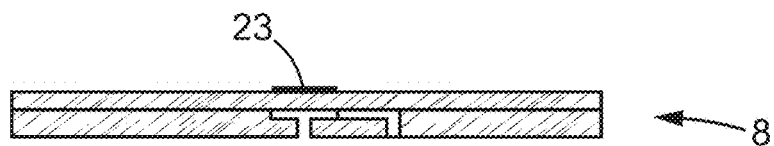
Figure 4G:
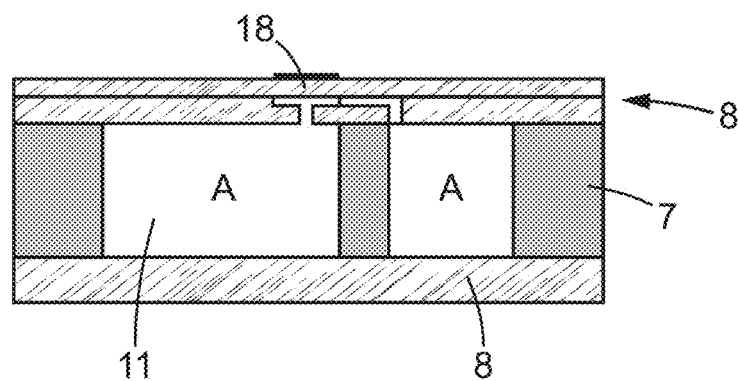
FIG. 4I illustrates a top view of the cell of FIG. 4H.
Figure 4H:
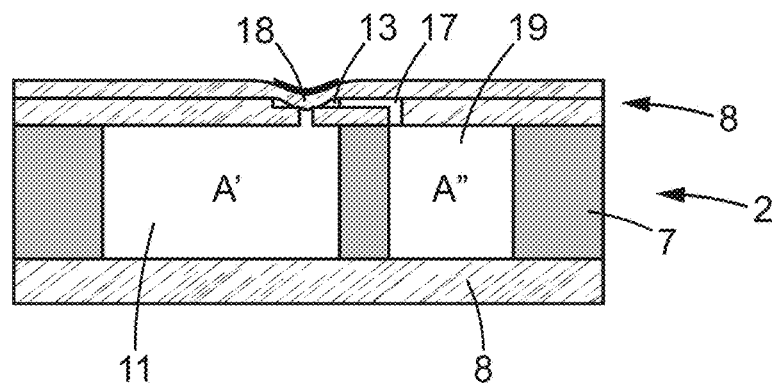
Figure 4I:
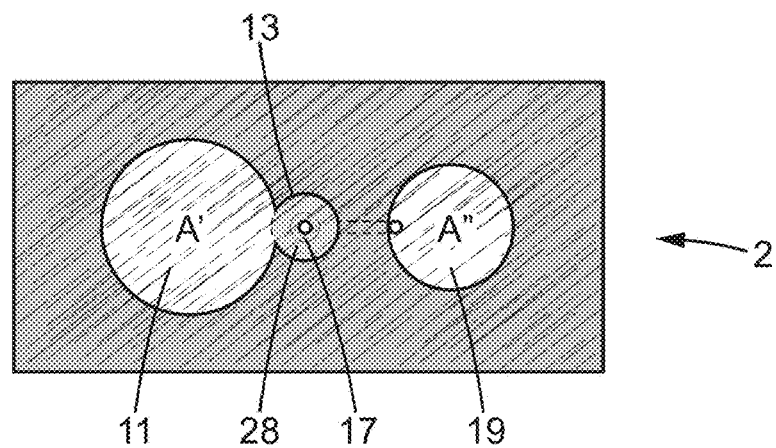
Figure 5A:
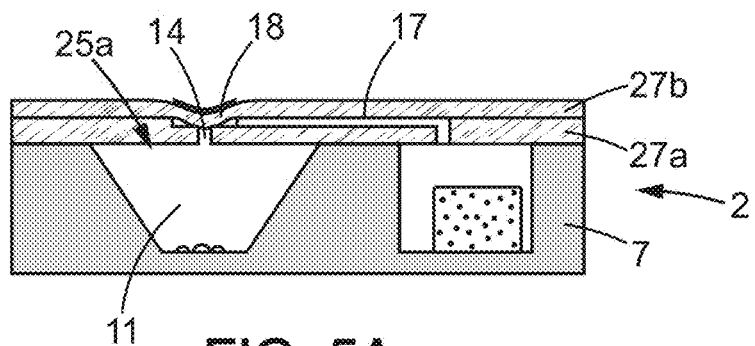
FIG. 5A illustrates a section view of an alternative embodiment of a cell according to the embodiment of FIGS. 4A to 4I, wherein the optical cavity is not a through-cavity and is of pyramidal shape.
Figure 5B:
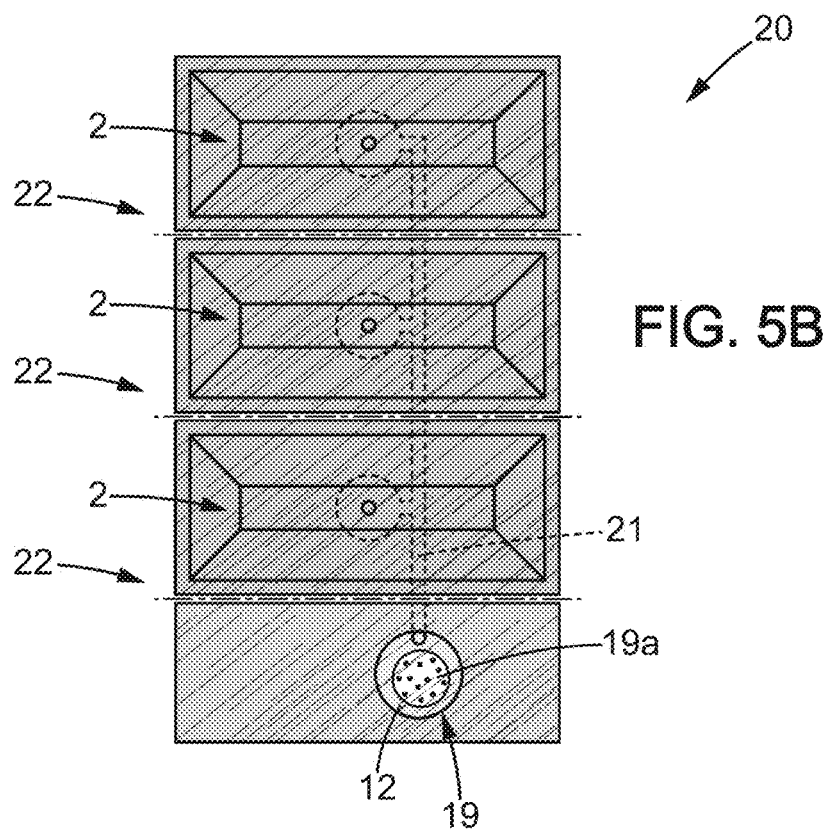
FIG. 5B illustrates a top view of a set of cells comprising a plurality of cells such as the one of FIG. 5A.
Figure 7A:
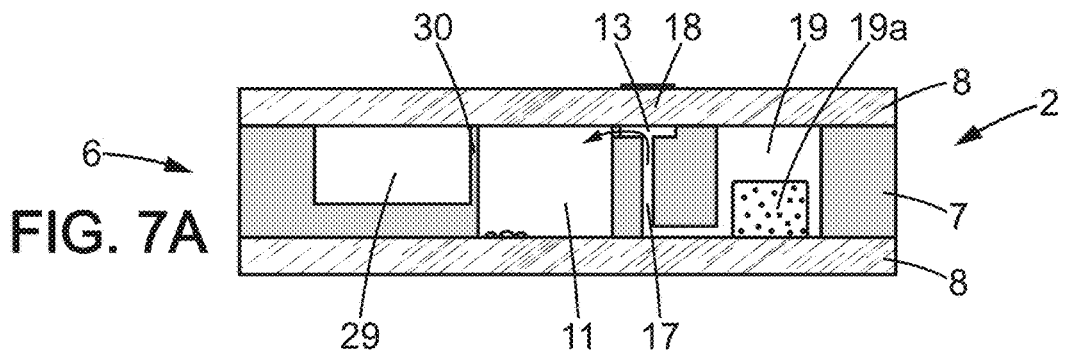
FIGS. 7A to 7C illustrate the successive steps in a method for filling a cell with gas according to an alternative embodiment of a cell such as the one of FIGS. 1 and 2A to 2E, wherein the cell comprises an additional cavity filled with additional gas; specifically.
Figure 7B:
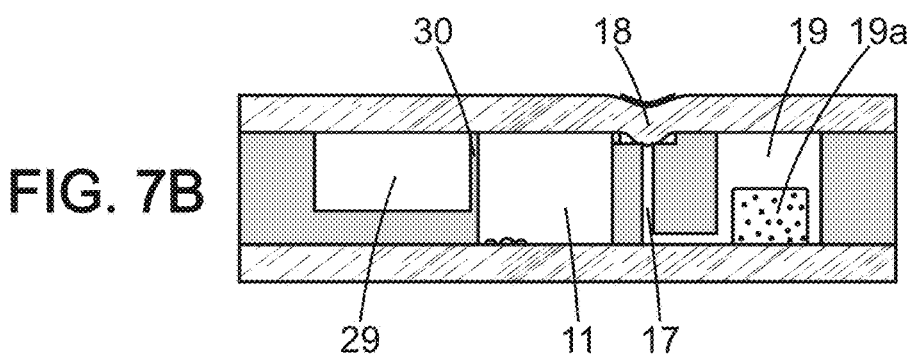
Figure 7C:
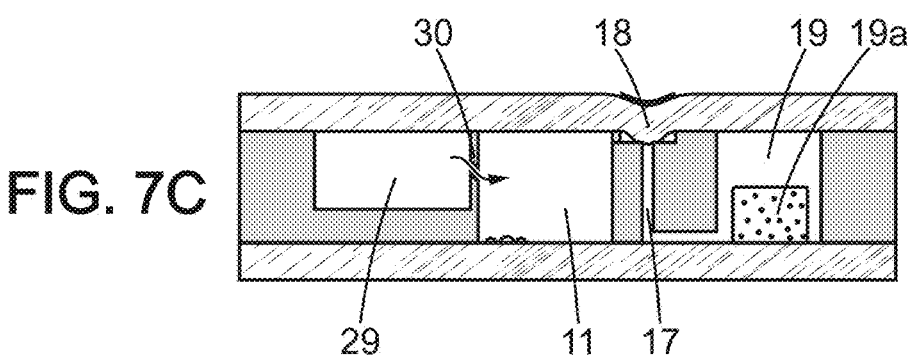
Figure 7D:
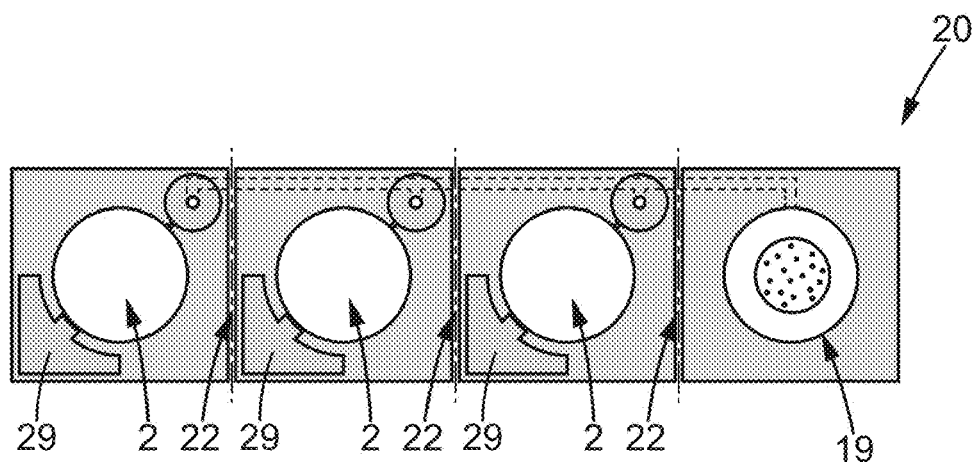
FIG. 7D illustrates a top view of a set of cells comprising a plurality of cells such as the ones in FIGS. 7A-7C, FIGS. 8A to 8C show the successive steps of a method for creating a vacuum in a cell according to an embodiment of the invention; specifically.

As shown in FIGS. 3E, 5B, 7D, a plurality of cells 2 may be arranged such that the gas inflow channels 17 of the cells 2 are connected to a single source cavity 19.

Such a plurality of cells 2 can then form a set 20 of cells.

Such a set 20 of cells may in particular be a single rigid assembly. The gas inflow channels 17 of the cells 2 can be connected to a common gas inflow channel 21 of the set 20.

The common gas inflow channel 21 can be connected to a source cavity 19 as detailed above for a single cell 2.

For example, the cells 2 of the set 20 may be fabricated from a single multilayer assembly 6. The set 20 may thus comprise a shapeable plate—or wafer—7 and at least one glass plate—or wafer—8 such that the optical vapor cells 2 of the set 20 share said shapeable plate—or wafer—7 and said at least one glass plate—or wafer—8.

The set 20 may also comprise catting portions 22 between the cells 2 of the set 20, suitable for cutting in order to separate the cells 2 of the set 20 after fabrication and filling with gas.

The cells 2 of the set 20 can thus be individually sealed and the amount of cesium in each cell 2 can be controlled. This reduces the size and manufacturing cost of the cells and can improve the performance of the clock.

Figure 9:
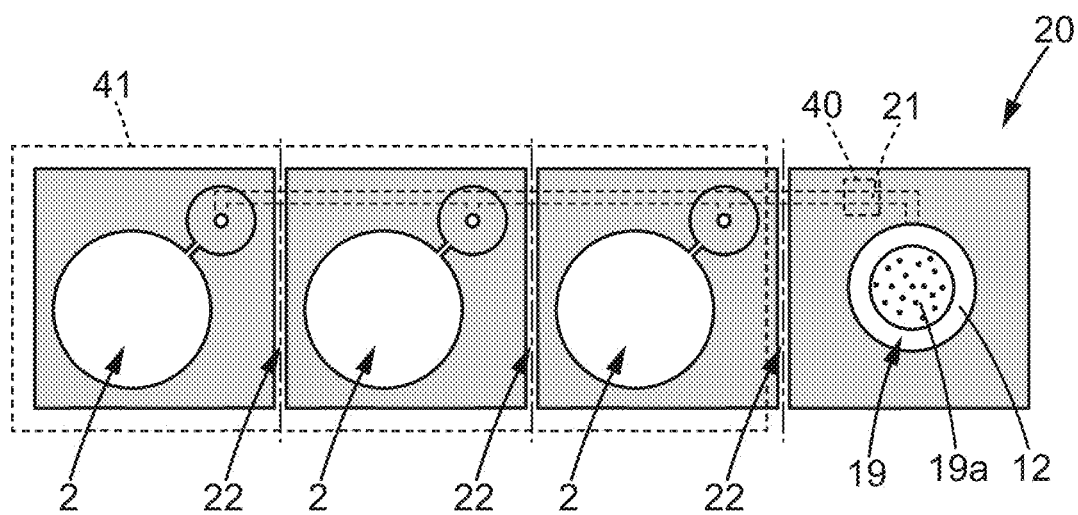
FIG. 9 illustrates a top view of a set of cells comprising a plurality of cells such as the one in FIGS. 3A to 3D, during implementation of one embodiment of a gas filling method according to the invention.

One particular embodiment of a method according to the invention which ensures an equal and well-controlled amount of cesium condensation in all cells of a plurality of cells is illustrated in FIG. 9.

This method can be implemented with each of the cell embodiments described in the present patent application, in particular with the plurality of cells as illustrated in FIGS. 3E, 5B or 7D.

In this method, after filling the optical cavity 11 with gas (step illustrated in FIGS. 3A, 4G, or 7A), for example by releasing the alkali vapor from the dispenser 19a, the set 20 of cells is heated to a temperature greater than a first predefined temperature.

In particular, at least one cavity region 41 comprising each gas cavity 11 of each of the cells 2 of the set 20 of cells is heated to the first predefined temperature.

This first predefined temperature may in particular be an elevated temperature relative to the target operating temperature, for example 20° C. above the target operating temperature for the atomic sensor 1 incorporating the cell or cells 2 of the set 20 of cells.

Figure 8A:
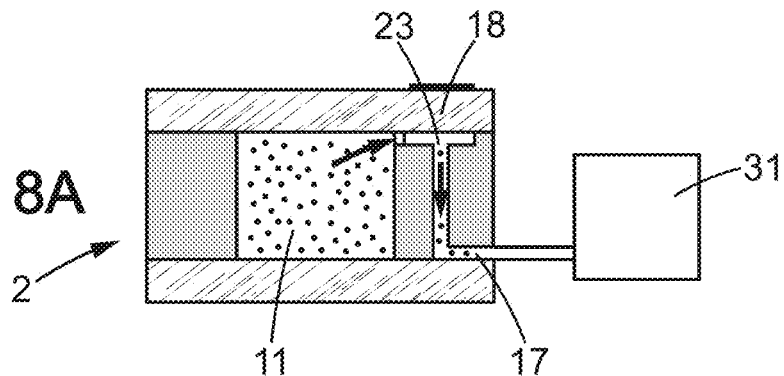
FIG. 8A illustrates the actuation of a pumping station in order to suction a gas contained in the optical cavity, FIG. 8B the sealing of the cell after creating a vacuum, by deformation of the membrane, and FIG. 8C the detachment of the cell from the pumping station.
Figure 8B:
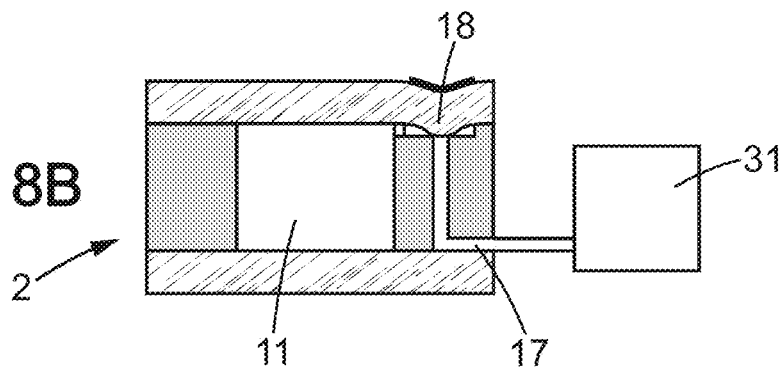
Figure 8C:
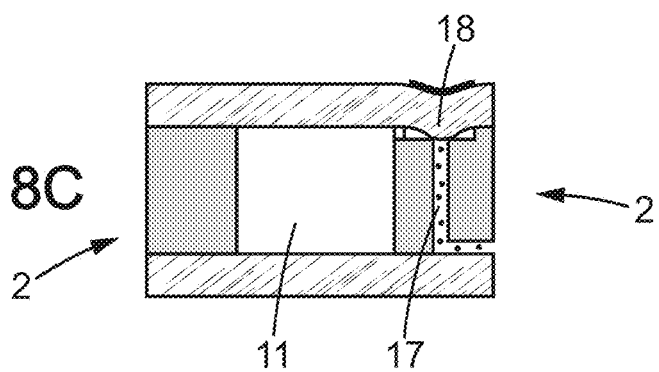

As illustrated in FIG. 8, a limited region 40 of the set 20 of cells is brought to a second predefined temperature.

The second predefined temperature is strictly lower than the first predefined temperature. For example, the second predefined temperature is 5° C. less than the first predefined temperature.

Region 40 is thus a cold region compared to the rest of the set 20 of cells.

Region 40 may for example be located in proximity to the source cavity 19.

Region 40 is a region of the set 20 of cells that is not part of a gas cavity 11 of a cell 2.

For example, region 40 may be a portion of the glass plate—or wafer—8 located near the source cavity 19.

The cooling of region 40 may in particular be carried out by contact with region 40, for example by contact between a cold arm and a portion of the glass plate—or wafer—8, possibly mediated by a heat conducting agent, for example a fat.

Because its temperature is lower than the temperature of the remainder of the set 20 of cells, most of the condensation generated by supplying gas via the common gas inflow channel 21 of the set 20 remains localized to region 40.

This is followed, where appropriate, by stabilization and passivation of the surfaces of the cells 2 as described elsewhere.

Due to the presence of the cold region 40 at the second temperature and due to their temperatures above the first temperature, the gas cavities 11 of the cells 2 of the set 20 of cells contain no or very little condensation but rather contain saturated alkali vapor alone or in the vast majority, in particular with a higher atomic density than at the operating temperature of the cell.

The cells 2 of the set 20 are then sealed.

The set 20 can then be cooled to the operating temperature of the cells 2. The saturation vapor pressure thus decreases and the excess alkali vapor trapped in the gas cavities 11 is condensed in each cell 2.

The amount of condensation trapped in this manner is properly determined and depends only on the volume of the gas cavity 11 and on the temperature difference between the second predefined temperature of region 40 during sealing of the gas cavities 11 and the operating temperature of the cells 2.

In this manner, one can obtain a low amount of condensation in order to avoid the risk of optical obstruction during operation of the cells 2 in an atomic sensor 1, but sufficient condensation to ensure a long service life for the atomic sensor 1 by replacing the alkali metal that is lost. Note that after passivation, a small amount of alkali metal is sufficient to guarantee a long service life for the atomic sensor 1.

The membrane 18 is suitable for being placed, secondly, in a deformed state, more particularly a state plastically deformed by heating. This deformed state of the membrane 18 is illustrated in FIGS. 1, 2E, 3B, 3C, 4H, 5A, 6, 7B, 7C, 8B, and 8C.

In this deformed state, the membrane 18 hermetically closes at least one among the cavity mouth 14 and the channel mouth 15. In this manner, the membrane 18 hermetically separates the optical cavity 11 from the gas inflow channel 17.

In this deformed state of the membrane 18, the optical cavity 11 is isolated from the gas inflow channel 17 and in particular is isolated from the exterior of the cell 2.

Thus, during a gas filling method according to the invention, once the optical cavity 11 filled with gas via the gas inflow channel 17, the membrane 18 is plastically deformed by heating so that it hermetically closes at least one among the cavity mouth 14 and the channel mouth 15 in such a way as to hermetically separate the optical cavity 11 from the gas inflow channel 17.

In one embodiment of the invention, the membrane 18 may be plastically deformed by heating with a laser directed onto the membrane 18.

To do this, the material of the membrane 18 may be absorbent to at least one wavelength of light so that it is heated by said laser directed onto the membrane 18.

More specifically, the membrane may comprise an outer face 18a of the membrane 18, opposite to an inner face 18b of the membrane 18 which covers the sealing access 16 of the sealing basin 13.

The outer face 18a of the membrane 18 is thus for example an outer face of the cell 2 and is therefore particularly easy to access.

The membrane 18 may be deformed by heating the outer face 18a of the membrane 18.

For example, a laser may be directed onto the outer face 18a of the membrane 18.

Such a laser may be for example a CO2 laser with a wavelength suitable for exciting the $SiO_2$ glass molecule, for example 10.6 microns.

Alternatively, the membrane 18 may be structured to be especially tolerant to laser irradiation, in particular tolerant to variable power laser irradiation. This is the case for example with CO2 lasers, which usually have power variations of about +/−5%.

Figure 10A:
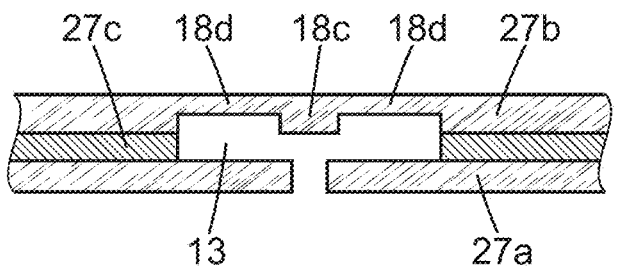
FIGS. 10A to 10C illustrate the successive steps of a method for filling a cell with gas according to two combined alternative embodiments of a cell wherein the cell membrane comprises a protrusion and the cell comprises a multilayer assembly comprising a first glass sub-layer, an intermediate layer, and a second glass sub-layer; specifically.
Figure 10B:
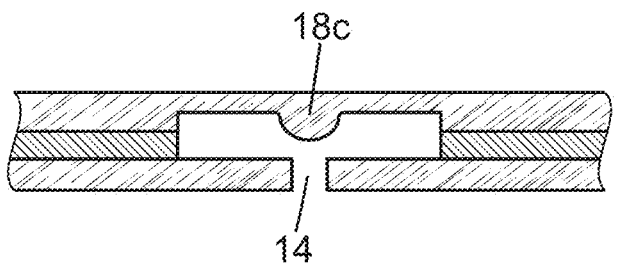
Figure 10C:
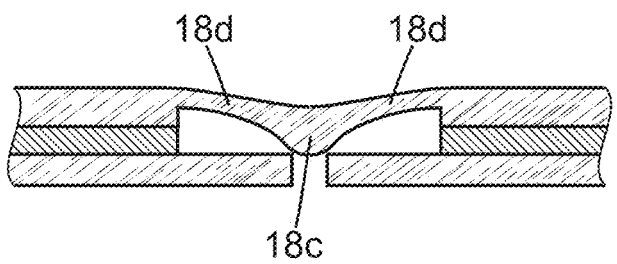

To this end, the membrane 18 may comprise a protrusion 18c facing the sealing basin 13 as illustrated in FIGS. 10A to 10C. The protrusion 18c is located for example in the center of the membrane 18. The protrusion 18c may in particular be placed on the inner face 18b of the membrane 18 and thus extends into the sealing basin 13.

The protrusion 18c constitutes a glass reserve in the membrane which increases the heat capacity. The side portion 18d of the membrane that surrounds the protrusion 18c ensures the distortion is to an extent suitable for the membrane 18 as illustrated in FIG. 10C.

In one particular embodiment, the dimensions of the protrusion 18c are adapted so that the protrusion can at least partially penetrate at least one among the cavity mouth 14 and the channel mouth 15.

FIGS. 10B and 10C illustrate the successive states of the membrane 18 during deformation of said membrane, in other words the melting of a portion of the membrane in FIG. 10B, particularly the protrusion 18c when such is present, and the overall deformation of the membrane in FIG. 10C.

Alternatively, the membrane 18 may be provided with a heating device 23 which enables heating and plastically deforming the membrane 18.

The heating device 23 may be arranged on an outer-face 18a of the membrane 18, opposite to an inner face 18b of the membrane 18 covering the sealing access 16 of the sealing basin 13. In one embodiment, the heating device 23 may be a layer 23 of a material absorbent to at least one wavelength of light that is not substantially absorbed by the membrane 18, in a manner that locally concentrates the energy in order to locally heat the membrane.

"Not substantially absorbed by the membrane" is understood to mean that the absorption of light at said wavelength of light, by the membrane 18, is not sufficient to plastically deform the membrane 18 by heating without requiring a laser of unacceptably high power to do so.

In this manner, a laser directed onto the membrane 18 can plastically deform the membrane 18 by heating.

In another embodiment of the invention, the membrane 18 may be plastically deformed by heating by Joule effect.

To do this, the heating device 23 in contact with the membrane 18 may be a resistive element 23 adapted to be traversed by an electric current in order to heat the membrane 18 by Joule effect.

Said resistive element 23 may be for example a layer of a resistive material.

The sealing basin 13 and the membrane 18 may be implemented in various ways which will now be further detailed.

Referring to FIGS. 2A to 2E, 3A to 3C, 6, 7A to 7C, and 8A to 8C, the sealing basin 13 may be formed in the shapeable plate—or wafer—7.

More specifically, the shapeable plate—or wafer—7 may be shaped to present a second recess 26 opening onto at least one second opening 26a. The second recess 26 can then form the sealing basin 13, and the second opening 26a the sealing access 16 of the sealing basin 13.

To form the second recess 26, the shapeable plate—or wafer—7 may be etched, for example by ion and/or chemical etching, in particular by etching via the second opening 26a of the second recess 26.

In one embodiment of the invention, the recess 25 forming a portion of the optical cavity 11 and the second recess 26 are etched on the same face of the shapeable plate—or wafer—7, for example the first face 7a.

In this embodiment, the cavity mouth 14 may be formed by an overlap of recess 25 and second recess 26 on the first face 7a of the shapeable plate—or wafer—7.

In another embodiment, the recess 25 forming a portion of the optical cavity 11 and the second recess 26 may be respectively etched on opposite sides of the shapeable plate—or wafer—7, respectively on the first face 7a and the second face 7b.

In this embodiment, the cavity mouth 14 may be formed by a connecting channel, defined in the shapeable plate—or wafer—7 and connecting the recess 25 forming a portion of the optical cavity 11 and the second recess 26. The connecting channel may in particular be defined by shaping a recess, for example by etching.

In a last embodiment, the recess 25 forming a portion of the optical cavity 11 may be a through-hole opening onto the two opposite faces 7a, 7b of the shapeable plate—or wafer—7.

In this embodiment, the cavity mouth 14 may then be formed by an overlap of recess 25 and second recess 26 on one of the faces 7a, 7b of the shapeable plate—or wafer—7.

Moreover, the gas inflow channel 17 may also be defined in the shapeable plate—or wafer—7, in particular by etching starting from the sealing basin 13.

The gas inflow channel 17 may lead to the location of the channel mouth 15 of the sealing basin 13 on the one hand and to at least a second channel mouth 24 on the other hand, for example located near the source cavity 19.

In one embodiment of the invention illustrated in FIGS. 1, 2A to 2E, 3A to 3C, 6, 7A to 7C, and 8A to 8C, the gas inflow channel 17 is formed in the shapeable plate—or wafer—7 so as to substantially traverse the entire thickness of said shapeable plate—or wafer—7, in a manner substantially perpendicular to the plane of extension H of said shapeable plate—or wafer—7.

The gas inflow channel 17 formed in the shapeable plate—or wafer—7 may also have bends or shapings appropriate for reaching the source 19.

Figure 2E:
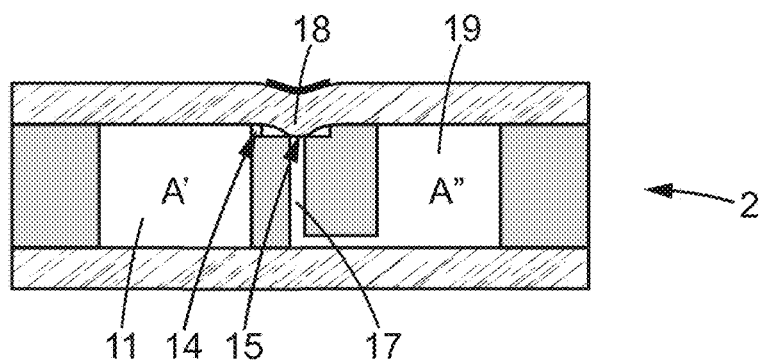

The sealing basin 13 is illustrated in particular in FIGS. 2D, 2E, and 2F, and may comprise a substantially flat sealing area 28 parallel to the membrane 18 in the undeformed state.

The sealing area 28 surrounds the channel mouth 15 and is designed to form a gas-tight contact with the membrane 18 in the deformed state.

In one particular embodiment of the invention, the channel mouth 15 and the sealing area 28 are substantially circular or coronal and concentric and form a bottom of the sealing basin 13 shaped in the shapeable plate—or water—7.

A distance between the membrane 18 in the non-plastically deformed state and the sealing area 28, measured perpendicularly to the membrane 18 in the non-deformed state and said sealing area 28, may in particular be less than one hundred microns, preferably less than a few tens of microns.

In this manner, the membrane 18 in the deformed state can easily seal the channel mouth 15 so as to hermetically separate the optical cavity 11 from the gas inflow channel 17.

More specifically, the sealing basin 13 may be substantially cylindrical in shape and may for example have a diameter of several tens of microns or several hundreds of microns, and preferably greater than three times said distance between the membrane 18, in the non-plastically deformed state, and the sealing area 28.

A diameter of the sealing area 28 may thus be greater than a few tens of microns, for example greater than one hundred microns.

In one embodiment illustrated in FIGS. 4A-4I, 5A-5B, the membrane 18 may be constituted of a portion of the glass plate—or wafer—8.

In particular, in this embodiment, the optical window 9 and the membrane 18 may be formed by two portions separated from each other by a single glass plate—or wafer—8.

Alternatively, the membrane 18 may be constituted by a portion of a second glass plate—or wafer—8. The two distinct glass plates—or wafer—8 can then be respectively placed on the respectively opposite faces 7a, 7b of the plate—or wafer—7 shaped to have a recess.

In the alternative embodiment of the invention illustrated in particular in FIGS. 4A-4I, 5A and 5B, the sealing basin 13 and the membrane 18 may both be formed in the glass plate—or wafer—8.

In this manner, the sealing basin 13 and the membrane 18 can in particular be placed above the optical cavity 11, meaning at the location of the opening 25a of the recess 25, as illustrated in FIG. 5A.

This will further reduce the size of the cell 2.

Specifically, the glass plate—or wafer—8 can then comprise at least a first glass sub-layer 27a and a second glass sub-layer 27b.

The first glass sub-layer 27a and the second glass sub-layer 27b can be stacked and joined together so as to be sealed to each other in a fixed and fluidtight manner, particularly by direct bonding between the facing sides. To bond two glass substrates, significant force can be applied while heating, and it is not necessary to implement an electrical discharge. The sealing basin 13 can then be formed in the first glass sub-layer 27a similarly to what has been described above regarding the shapeable plate—or wafer—7.

Thus, the first glass sub-layer 27a can be shaped to present the second recess 26 opening into at least a second opening 26a. The second recess 26 can then form the sealing basin 13, and the second opening 26a can form the sealing access 16 of the sealing basin 13.

In this embodiment, the cavity mouth 14 can be a channel entirely traversing the first glass sub-layer 27a, which ends facing the optical cavity 11 and in particular at the location of the opening 25a of the recess 25 forming a portion of the optical cavity 11.

The gas inflow channel 17 may also be defined, at least in part, in the first glass sub-layer 27a in a manner similar to what has been described above for the shapeable plate—or wafer—7.

The sealing basin 13 and/or the gas inflow channel 17 defined in the first glass sub-layer 27a may also have the same characteristics and dimensions as the sealing basin 13 and/or the gas inflow channel 17 defined in the shapeable plate—or wafer—7 described above.

To form the second recess 26, the first glass sub-layer 27a can be etched, for example by ion and/or chemical etching, in particular by etching via the second opening 26a of the second recess 26.

The membrane 18 can then be formed in the second glass sub-layer 27b in a manner similar to what has been described above in relation to the glass plate—or wafer—8.

The membrane 18 can then be constituted by a portion of the second glass sub-layer 27b.

In this embodiment, the plastically deformed membrane 18 can come to hermetically close the cavity mouth 14 so as to hermetically separate the optical cavity 11 from the gas inflow channel 17.

A variant of this embodiment is illustrated in FIGS. 10A to 10C.

In this variant, the multilayer assembly 6 further comprises an intermediate layer 27c for anodic bonding. The intermediate layer 27c is arranged between the first glass sub-layer 27a and the second glass sub-layer 27b.

The intermediate layer 27c is for example a silicon layer.

The intermediate layer 27c is adapted to allow anodic bonding between the first glass sub-layer 27a and the second glass sub-layer 27b. In this manner, there is no longer a need to create a glass-to-glass bond between the first glass sub-layer 27a and the second glass sub-layer 27b.

The intermediate layer 27c is for example a layer of a thickness of 100 to 200 microns.

The intermediate layer 27c may be formed to leave the optical window 9 of the cell 2 unobstructed so as not to impede the passage of the exterior laser beam 5.

The intermediate layer 27c may also be shaped to form part of the sealing basin 13 and/or a portion of the gas inflow channel 17, for example to form the vertical walls of the sealing basin 13 and/or of a portion of the gas inflow channel 17 while the first glass sub-layer 27a forms the bottom of the sealing basin 13 and/or of said portion of the gas inflow channel 17.

Alternatively, all of the sealing basin 13 and/or of a portion of the gas inflow channel 17 may be formed in the intermediate layer 27c. The first glass sub-layer 27a can then include the cavity mouth 14 and/or an additional portion of the gas inflow channel 17.

Figure 6:
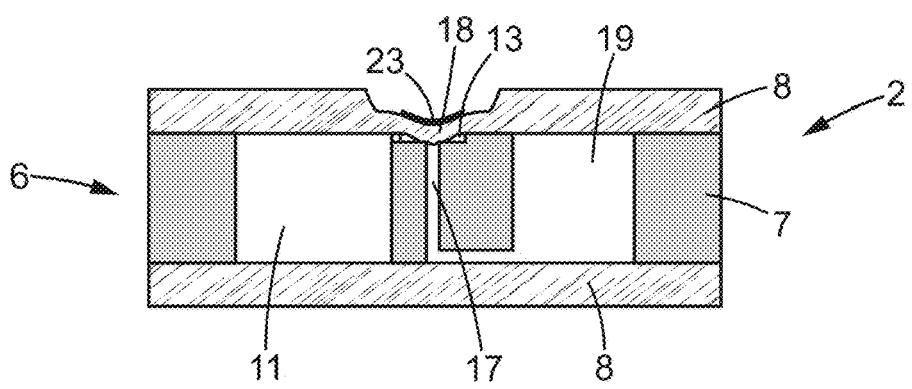
FIG. 6 shows a section view of an alternative embodiment of a cell according to the embodiment of FIGS. 1 and 2A to 2E, wherein the membrane is a thinned portion of a glass plate—or wafer.

To facilitate deformation of the membrane 18, the membrane 18 may in particular be a thinned portion of a glass plate—or wafer—8, as shown in FIG. 6.

"A thinned portion of a glass plate—or wafer" is understood to mean a thinned portion of an entire glass plate—or wafer—8 or a thinned portion of the second glass sub-layer 27b of a glass plate—or wafer—8.

For example, the thickness of the membrane 18 may thus be less than a few hundred microns, for example 500 microns, or less than 200 microns, or even less than a hundred microns.

As illustrated in FIGS. 7A to 7D, the cell 2 may further comprise an additional cavity 29 adapted to be filled with an additional gas.

The additional gas filling the additional cavity 29 may be a buffer gas or a component of the buffer gas as described above. The additional gas may thus be such that it slows the diffusion of alkali atoms towards the walls of the cell 2 and confines said alkali atoms. The additional gas may also be such that the dependence of the spectral values on the temperature induced by the buffer gas has an inversion point around the operating temperature of the cell 2.

The additional gas may for example comprise dinitrogen and/or argon.

The additional cavity 29 is adjacent to the optical cavity 11. More specifically, the additional cavity 29 is separated from the optical cavity 11 by a wall 30 designed to be pierced and to permit mixing the additional gas with a gas contained within the optical cavity 11.

In this manner, it is possible to fill the optical cavity 11 with an alkali gas by means of a dispenser 19a, to hermetically separate the optical cavity 11 from the dispenser 19a by deformation of the membrane 18, and finally to pierce the wall 30 separating the additional cavity 29 from the optical cavity 11 so as to mix said additional gas with a gas contained within the optical cavity 11.

In this manner, any interaction between the additional gas and the dispenser 19a is prevented.

Furthermore, if a source of alkali metal is used instead of a dispenser 19a, for example a chemical compound based on barium, such as a mixture of cesium chloride and barium azide, reabsorption of the gas of the optical cavity 11 by the barium is also prevented.

If the source of alkali metal is cesium azide, the undesirable production of additional dinitrogen in the optical cavity 11 due to unwanted decomposition of the cesium azide is also prevented.

In this manner, more generally any interaction between the additional gas or the gas contained in the optical cavity 11 and the source of alkali metal coming from the source cavity 19 is thus prevented.

In an exemplary embodiment of the invention, a movable member is housed in the additional cavity 29. The movable member is adapted to be moved by an external action, for example by a magnetic force, so as to pierce the wall 30 of the additional cavity 29.

In another embodiment of the invention, the wall 30 of the additional cavity 29 is adapted to be pierced by a contactless action exogenous to the cell 2, in particular by interaction of a pulsed laser beam, continuous laser beam, or electric discharge, with the wall 30.

The wall 30 may be constructed at an angle and/or may include indentations so as to facilitate piercing or breaching it.

Furthermore, when piercing the wall, the volume occupied by the additional gas and the gas of the optical cavity 11 increases and their respective partial pressures decrease.

For a given target pressure, the pressure of the additional gas to be reached in the additional cavity 29 is therefore greater than said target pressure and depends on the volume of the cavities 29 and 11. This offers the possibility of anodic bonding between the plates—or wafer—of the multilayer assembly 6 at a pressure higher than the target pressure (typically 10 kPa), which advantageously increases the voltage that can be applied without creating an electrical discharge across the gas.

By varying the volume of the additional cavity 29 between two different cells, it is possible to obtain cells of two different pressures on the same substrate, in particular in the same set 20 of cells.

This is useful for correcting non-uniform pressures due for example to temperature gradients during anodic bonding, and for increasing the production yield. It is also possible to perform optimization tests quite quickly.

Furthermore, by sealing the additional cavities 29 with an additional gas that is different from the source gas supplied by the source 19, a mixture of the two gases is obtained after piercing the wall 30. By varying the ratios of the volumes of the cavities 29, 11 between the cells 2 of a same substrate, in particular of the same set 20 of cells, buffer atmospheres having different partial pressure ratios can be produced in one step. In the case where variations in the partial pressure ratio of the additional gas and the source gas are observed in the same substrate, it is thus possible to compensate for this in order to increase production yield. This solution is also of interest in determining the optimal composition of a buffer atmosphere.

Furthermore, the walls of the optical cavity 11 may be covered with an anti-relaxation coating. Such an anti-relaxation coating is designed to limit the loss of coherence induced by collisions of atoms with the walls of the optical cavity 11.

Some anti-relaxation coatings cannot withstand the high temperature of anodic bonding.

In the present invention, such an anti-relaxation coating can be introduced into the cell 2 by the gas inflow channel 17 and the sealing basin 13, and in particular after the steps of anodic bonding. The membrane 18 is then plastically deformed after introduction of the anti-relaxation coating in order to seal the cell 2 without damaging the anti-relaxation coating.

Finally, in a variant embodiment of the invention, the gas inlet channel 17 of the cell 2 may be connected to a pumping station 31 capable of suctioning a gas contained in the optical cavity 11.

A method for establishing a vacuum in a cell 2 can thus comprise the actuation of the pumping station 31 in order to suction a gas contained in the optical cavity 11.

After actuation of said pumping station 31 has established sufficient vacuum in the optical cavity 11, the gas inflow channel 17 can then be separated from the optical cavity 11 by deformation of the membrane 18.

"Vacuum" is understood to mean a pressure less than atmospheric pressure and preferably less than $10^{-4}$ mbar.

The pumping station 31 may in particular be actuated after the steps of anodic bonding.

In this manner, it is possible to achieve the conditions necessary for the magneto-optical trapping of atoms or ion trapping.

The invention claimed is:

1. A gas cell, in particular for inclusion in an atomic sensor associated with at least one laser emitting an incoming exterior laser beam striking the cell as well as with a photodetector for receiving an exterior laser beam exiting the cell, the laser beam having penetrated the cell, the cell comprising an optical cavity provided with at least one optical window and adapted to be filled with a gas, the laser beam having gone through the at least one optical window and the optical cavity
the cell comprising
   a multilayer assembly comprising:
      a shapeable plate—or wafer—shaped to present a recess opening into at least one opening, said recess being adapted to be filled with a gas, and
      at least one glass plate—or wafer—hermetically closing said opening of the recess to form the optical cavity provided with at least one optical window, the glass plate or wafer and the shaped plate—or wafer—with recess being arranged facing one another and sealed to one another, in particular by anodic bonding;
   a sealing basin comprising
      a cavity mouth adapted to allow the passage of gas between the sealing basin and the optical cavity,
      a channel mouth designed to allow gas to enter the sealing basin via a gas inflow channel, and
      a sealing access, and
   a membrane being a portion of the glass plate—or wafer—hermetically closing the sealing access of the sealing basin,
wherein the cell is arranged such that the membrane is capable of hermetically closing at least one among the cavity mouth and the channel mouth when said membrane is plastically deformed by heating in a direction perpendicular to a section of the cavity mouth or the channel mouth being closed, said section being perpendicular to a direction, of a gas flowing through said section of the cavity mouth or the channel mouth being closed, in such a way as to hermetically separate the optical cavity from the gas inflow channel.

2. The cell according to claim 1, further comprising a heating device in contact with the membrane, in particular a resistive element adapted to be traversed by an electric current or a layer of a material that is absorbent to at least one wavelength of light which is not absorbed by the membrane.

3. The cell according to claim 1, wherein the optical window and the membrane are formed by two portions separated from one another by a single glass plate—or wafer.

4. The cell according to claim 1, wherein the shapeable plate—or wafer—is shaped to present a second recess forming the sealing basin and opening into at least a second opening forming the sealing access.

5. The cell according to claim 1, wherein the sealing basin and the membrane are formed in the glass plate—or wafer, in particular wherein the glass plate—or wafer—comprises at least a first glass sub-layer and a second glass sub-layer which are superimposed and integrally secured, the sealing basin being formed in the first glass sub-layer, the membrane being formed in the second glass sub-layer.

6. The cell according to claim 1, wherein the glass plate—or wafer—comprises a first glass sub-layer and a second glass sub-layer and wherein the multilayer assembly further comprises an intermediate layer for anodic bonding, in particular of silicon, arranged between the first glass sub-layer and the second glass sub-layer so as to enable anodic bonding between the first glass sub-layer and the second sub-glass layer,
in particular wherein
the membrane is formed in the second glass sub-layer,
at least the cavity mouth is formed in the first glass sub-layer, and
the intermediate layer for anodic bonding is shaped to leave at least the optical window unobstructed.

7. The cell according to claim 1, wherein the gas inflow channel is formed in at least one among the shapeable plate—or wafer—and the glass plate—or wafer, so as to traverse the entire thickness of said plate—or wafer, in a manner perpendicular to a plane of extension of said plate—or wafer.

8. The cell according to claim 1, wherein the membrane is glass, and in particular is a thinned portion of a glass plate—or wafer.

9. The cell according to claim 1, wherein the membrane comprises a protrusion facing the sealing basin, in particular a protrusion on the inner face of the membrane, extending into the sealing basin.

10. The cell according to claim 1, wherein the sealing basin comprises a sealing area surrounding the channel mouth, planar and parallel to the non-deformed membrane, and adapted to form a hermetic contact with the membrane plastically deformed by heating so as to hermetically separate the optical cavity-from the gas inflow channel.

11. The cell according to claim 10, wherein a distance between the non-plastically deformed membrane and the sealing area—measured perpendicularly to said non-plastically deformed membrane and said sealing area—is less than a hundred microns.

12. The cell according to claim 10, wherein a diameter of the sealing area of the sealing basin is greater than three times said distance between the non-plastically deformed membrane and the sealing area.

13. The cell according to claim 1, wherein a thickness of the membrane is less than 500 microns.

14. The cell according to claim 1, comprising a gas source connected to the gas inflow channel and adapted to fill the optical cavity with a gas via the gas inflow channel and the sealing basin, by means of the cavity mouth and the channel mouth.

15. The cell according to claim 14, wherein the source comprises a source cavity connected to the gas inflow channel and a dispenser of alkali metal received in the source cavity and adapted to generate alkali vapor by heating.

16. The cell according to claim 1, comprising, in addition to the optical cavity, an additional cavity filled with an additional gas, adjacent to the optical cavity and separated therefrom by a wall intended to be pierced to enable mixing said additional gas with a gas contained within the optical cavity.

17. The cell according to claim 16, wherein the wall of the additional cavity is adapted to be pierced by a contactless action exogenous to the cell, in particular by interaction of a pulsed laser beam, a continuous laser beam, or an electric discharge, with the wall.

18. The cell according to claim 1, wherein the optical cavity is filled with a gas, and wherein the membrane is in a plastically deformed state in which the membrane hermetically closes at least one among the cavity mouth and the channel mouth, hermetically separating the optical cavity from the gas inflow channel.

19. A set of cells comprising a plurality of cells according to claim 1, wherein the gas inflow channels are connected to a single gas source, in particular wherein said plurality of cells forms an integral and rigid assembly adapted to be cut so as to separate the cells from one another.

20. A method for filling a cell with gas, wherein:
a cell according to claim 1 or a set of cells according to claim 19 is provided,
a gas source connected to the gas inflow channel of the cell or set of cells is provided,
the optical cavity is filled with gas from the source via the gas inflow channel and the sealing basin, by means of the cavity mouth and the channel mouth, and
the membrane is plastically deformed by heating so as to hermetically close at least one among the cavity mouth and the channel mouth, in such a way that it hermetically separates the optical cavity from the gas inflow channel.

21. A gas filling method according to claim 20, wherein the membrane is plastically deformed by heating an outer face of the membrane, said outer face being in particular a face external to the cell.

22. The gas filling method according to claim 20, wherein the membrane is plastically deformed by heating using a laser directed onto the membrane.

23. The gas filling method according to claim 20, wherein the membrane is plastically deformed by heating, by allowing an electric current to flow through a resistive element in contact with the membrane.

24. The gas filling method according to claim 20, wherein the source is a dispenser of alkali metal received within a source cavity connected to the gas inflow channel of the cell or set of cells, and wherein the optical cavity is filled by heating said dispenser.

25. The gas filling method according to claim 20, wherein, after the membrane is plastically deformed in order to hermetically separate the optical cavity from the gas inflow channel, the cell is detached from the gas source.

26. The gas filling method according to claim 20, wherein, after the membrane is plastically deformed in order to hermetically separate the optical cavity from the gas inflow channel, a wall separating the optical cavity from an additional cavity filled with an additional gas is pierced so as to mix said additional gas with a gas contained within the optical cavity.

27. The gas filling method according to claim 20, wherein a set of cells is provided, each cell being in particular for inclusion in an atomic sensor, associated with at least one laser emitting an incoming exterior laser beam, striking the cell as well as with a photodetector for receiving an exterior laser beam exiting the cell, the laser beam having penetrated the cell, the cell comprising an optical cavity provided with at least one optical window and adapted to be filled with a gas, the laser beam having gone through the at least one optical window and the optical cavity
the cell comprising a multi layer assembly comprising a shapeable plate—or wafer—shaped to present a recess opening into at least one opening, said recess being adapted to be filled with a gas, and at least one glass plate—or wafer— hermetically closing said opening of the recess to form the optical cavity provided with at least one optical window, the glass plate or—wafer—and the shaped plate—or wafer— with recess being arranged facing one another and sealed to one another, in particular by anodic bonding; a sealing basin comprising a cavity mouth adapted to allow the passage of gas between the sealing basin and the optical cavity, a channel mouth designed to allow gas to enter the scaling basin via a gas inflow channel, and a sealing access, and a membrane being a portion of the glass plate—or wafer— hermetically closing the sealing access of the sealing basin, wherein the cell is arranged such that the membrane is capable of hermetically closing, at least one among the cavity mouth and the channel mouth when said membrane is plastically deformed by heating, in such a way as to hermetically separate the optical cavity from the gas inflow channel, each cell comprising, in addition to the optical cavity, an additional cavity filled with an additional gas, adjacent to the optical cavity and separated therefrom by a wall intended to be pierced to enable mixing said additional gas with a gas contained within the optical cavity, wherein the wall of the additional cavity is adapted to be pierced by a contactless action exogenous to the cell, in particular by interaction of a pulsed laser beam, a continuous laser beam, or an electric discharge, with the wall and wherein, after having filled the optical cavity with gas from the source,
at least the gas cavities of the cells of the set of cells are brought to a temperature above a first predefined temperature, said first predefined temperature being greater than a cell operating temperature of the set of cells, and a cold region of the set of cells is brought to a second predefined temperature that is strictly less than the first predefined temperature,
the membrane of each cell of the set of cells is plastically deformed by heating while maintaining the temperatures of the gas cavities of the cells and the cold region of the set of cells, and
the gas cavities of the cells of the set of cells are cooled to the operating temperature of said cells.

28. A method for creating a vacuum in a cell, wherein:
a cell according to claim 1 or a set of cells according to claim 19 is provided,
a pumping station connected to the gas inflow channel of the cell or set of cells is provided,
the pumping station is operated so as to suction gas contained in the optical cavity via the gas inflow channel and sealing basin, by means of the cavity mouth and channel mouth, and
the membrane is plastically deformed by heating, so as to hermetically close at least one among the cavity mouth and the channel mouth, in such a way as to hermetically separate the optical cavity from the gas inflow channel.

29. A method for fabricating a cell according to claim 1, wherein
a shapeable plate—or wafer—and at least one glass plate—or wafer—is provided,
the shapeable plate—or wafer—is shaped, in particular is etched, to form a recess opening into at least one opening,
at least one among the shapeable plate—or wafer—and the glass plate—or wafer—is shaped, in particular etched, so as to form a gas inflow channel and a sealing basin comprising
a cavity mouth adapted to allow the passage of gas between the sealing basin and the optical cavity,
a channel mouth designed to allow gas to enter the sealing basin via the gas inflow channel, and
a sealing access,
a multilayer assembly comprising the shapeable plate—or wafer—and said at least one glass plate—or wafer—is formed such that
the opening-of the recess is hermetically closed to form an optical cavity having at least one optical window and adapted to be filled with a gas, and
the sealing access is hermetically closed with a membrane capable of being plastically deformed by heating so as to hermetically close at least one among the cavity mouth and the channel mouth, in such a way as to hermetically separate the optical cavity from the gas inflow channel.

30. A atomic sensor comprising a cell according to claim 1, associated in a compact manner with a laser emitting an incoming exterior laser beam striking the cell, and with a photodetector for receiving an exterior laser beam exiting the cell.

31. A gas cell, in particular for inclusion in an atomic sensor associated with at least one laser emitting an incoming exterior laser beam striking the cell as well as with a photodetector for receiving an exterior laser beam exiting the cell, the laser beam having penetrated the cell, the cell comprising an optical cavity provided with at least one optical window and adapted to be filled with a gas, the laser beam having gone through the at least one optical window and the optical cavity, the gas cell comprising
a multilayer assembly comprising:
a shapeable plate—or wafer—shaped to present a recess opening into at least one opening, said recess being adapted to be filled with a gas, and
at least one glass plate—or wafer—hermetically closing said opening of the recess to form the optical cavity provided with at least one optical window, the glass plate—or wafer—and the shaped plate—or wafer—with recess being arranged facing one another and sealed to one another, in particular by anodic bonding;
a scaling basin comprising
a cavity mouth adapted to allow the passage of gas between the sealing basin and the optical cavity,
a channel mouth designed to allow gas to enter the sealing basin via a gas inflow channel, and
a sealing access, and a membrane being a portion of the glass plate—or wafer—hermetically closing the sealing access of the sealing basin, wherein:
- the cell is arranged such that the membrane is capable of hermetically closing at least one among the cavity mouth and the channel mouth when said membrane is plastically deformed by heating, in such a way as to hermetically separate the optical cavity from the gas inflow channel; and
- the glass inflow channel is formed in at least one of the shapeable plate—or wafer—and the glass plate—or wafer, so as to traverse the entire thickness of said plate—or wafer, in a manner perpendicular to a plane of extension of said plate—or wafer.

* * * * *